United States Patent [19]
Wisherd et al.

[11] Patent Number: 5,027,082
[45] Date of Patent: Jun. 25, 1991

[54] SOLID STATE RF POWER AMPLIFIER HAVING IMPROVED EFFICIENCY AND REDUCED DISTORTION

[75] Inventors: David S. Wisherd; Howard D. Bartlow, both of Sunnyvale; Pablo E. D'Anna, Los Altos, all of Calif.

[73] Assignee: Microwave Modules & Devices, Inc., Mountain View, Calif.

[21] Appl. No.: 517,328

[22] Filed: May 1, 1990

[51] Int. Cl.[5] ............................................. H03F 3/193
[52] U.S. Cl. ................................... 330/277; 330/149; 330/307
[58] Field of Search ................ 330/149, 277, 292, 307

[56] References Cited

PUBLICATIONS

Sone et al., "Ku-And K- Band Internally Matched High-Power GaAs F.E.T. Amplifiers", *Electronics Letters*, vol. 15, No. 18, Aug. 30, 1979, pp. 562–564.

*Primary Examiner*—James B. Mullins
*Attorney, Agent, or Firm*—Henry K. Woodward

[57] ABSTRACT

An RF power device including a DMOS field effect transistor has increased efficiency and reduced distortion. A capacitor is connected between the gate and source input of the transistor which swamps non-linear variations of the parasitic capacitance ($C_{GD}$) between the gate and drain, thereby offsetting the Miller effect of the feedback provided by the MOS transistor parasitic capacitance. The capacitor, the Ciss of the MOS transistor, and the inductance of input leads provide a device input resonant frequency between the input signal fundamental frequency and the first harmonic.

10 Claims, 3 Drawing Sheets

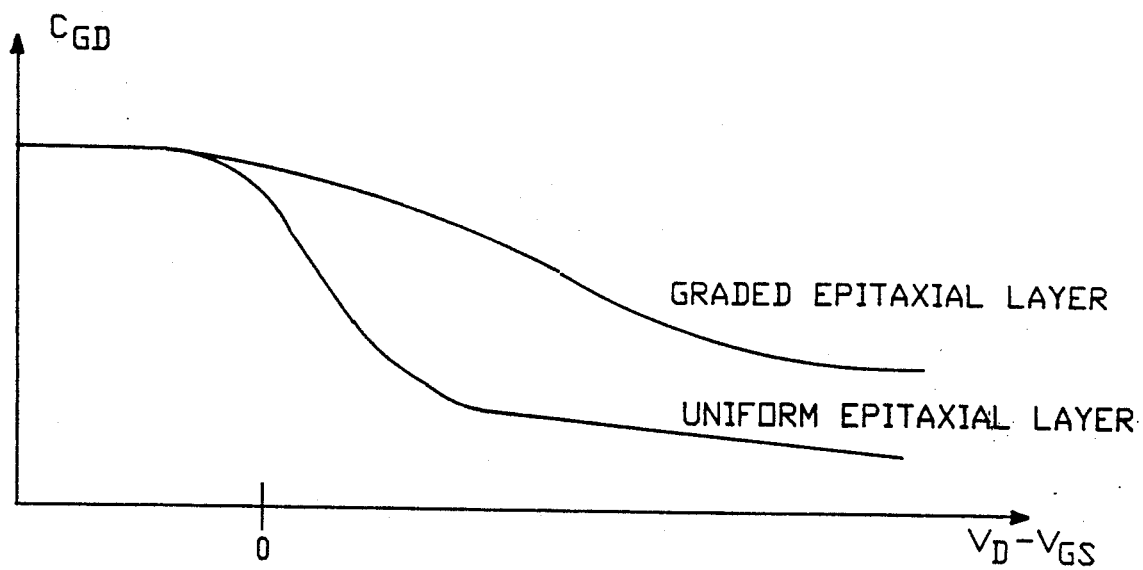
FIG.−4
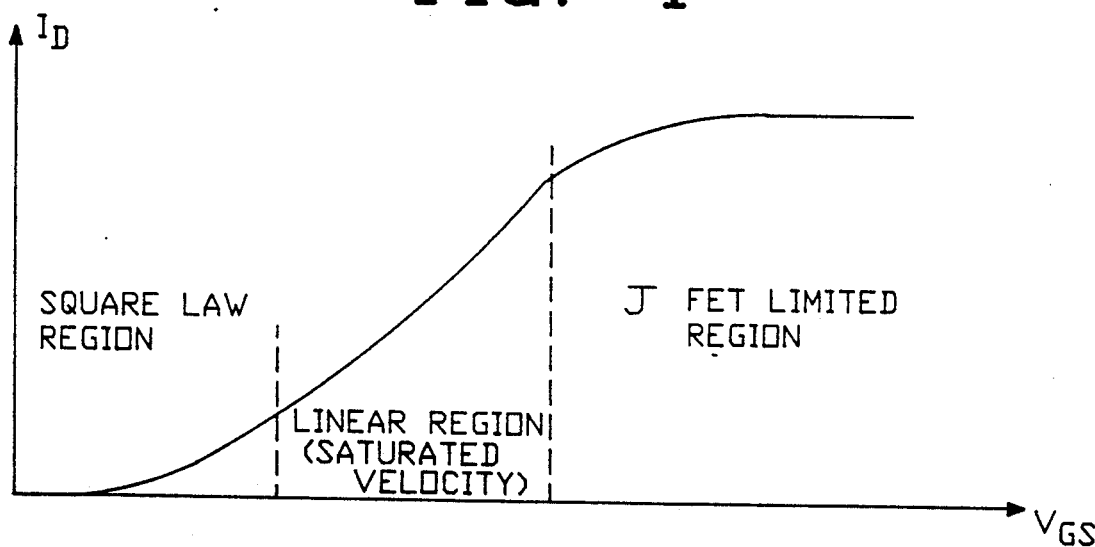
FIG.−5
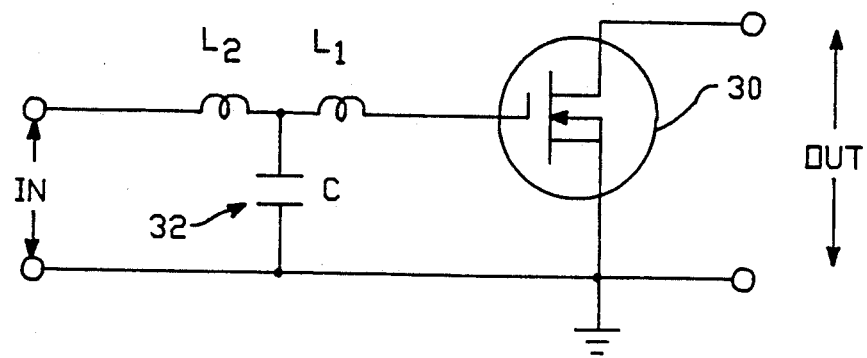
FIG.−6

SOLID STATE RF POWER AMPLIFIER HAVING IMPROVED EFFICIENCY AND REDUCED DISTORTION

BACKGROUND OF THE INVENTION

This invention relates generally to radio frequency (RF) power amplifiers (PA), and more particularly the invention relates to a solid state device used in RF PA having improved operating efficiency and reduced signal distortion.

Power amplifiers (PAs) are used when the efficiency and output power of an amplifying circuit are the important considerations. The various types of PAs are identified by their classes of operation, that is, Classes A, B, D, D, E, F, G, H, and S. Except for Class A, all of these amplifier types are easily differentiated from small-signal amplifiers by their circuit configurations, methods of operation, or both. There is no sharp dividing line between small signal and Class A power amplifiers; the choice of terms depends upon the intent of the designer.

Class A solid state power amplifiers are capable of providing highly linear amplification. However, they are considered cost-prohibitive for extremely high power transmitters (greater than 1 KW) because of fairly low power efficiency. As a result, for example, the TV transmitter industry has been forced to use bulky tube or Klystron amplifiers which require warm-up time, are narrow band, and are very inefficient in comparison to Class AB solid state power amplifiers. Class AB solid state power amplifiers do not have the high linearity and low distortion products that Class A solid state power amplifiers have. However, the power that they can provide is typically about 3-5 times greater, and their efficiency is far superior. A solid state device in a Class A power amplifier is always biased fully on, which means, in the case of a visual TV signal, it will pull the same current whether it is amplifying an all black signal (highest average power) or an all white signal (lowest average power). The transistor in a Class AB power amplifier is biased so that it is only slightly on. It will pull current in proportion to how it is being driven. When the amplifier is transmitting the highest average power, all black signal, it will pull the required current needed to get full power out. When transmitting a signal that has less average power (normal TV color pattern or an all white signal), a significantly less amount of current will be drawn. The use of solid state transistors in Class AB power amplifiers, which, generally, are more efficient than tube or klystron amps, greatly increases the overall efficiency of a television transmitter and reduce operating costs.

Power amplifiers built with power semiconductor devices, operating with the bias set in such a fashion as to operate in so called Class AB, exhibit amplitude and phase non-linearities that need to be corrected if the output is to reproduce the input with fidelity. These non-linearities lead to the production of unwanted signals at the output that need to be suppressed.

Because the bandwidth of a typical RF signal (such as a television visual signal) is usually a small fraction of the carrier frequency, the unwanted signals in the output of the power amplifier may be divided into three categories. FIG. 1 depicts the relationship of these signals to the desired signal, which consists in this case of two tones of equal amplitudes at frequencies fc± fm. Amplifier non-linearity produces two types of unwanted signals, called harmonics and intermodulation distortion (IMD) products. The IMD products (identified as third, fifth, seventh, and ninth orders in FIG. 1) are prominent near the carrier frequency. They cause distortion in the received signal and/or adjacent channel interference. Other unwanted signals include parasitic and sub-harmonic oscillations and mixer products; they are called spurious products or simply "spurs". In an RF PA, the harmonics and some of the spurious products may be removed by filters; however, the IMD generated must be of an acceptably low level. Phase distortion (more predominant in Class AB amplifiers that employ bipolar transistors) will cause an uneven amplitude in the IMD products as shown in FIG. 2.

Present techniques to deal with amplitude and phase distortion in power RF amplifiers operating in Class AB is to predistort the input signal to compensate for the distortion introduced in the final amplifier by the use of a preconditioner amplifier. However, there is a limit to this technique. The need for amplitude linearity is quite obvious from FIG. 1, however the need for phase linearity is not so obvious. It can manifest itself, for example, in power amplifiers for the processing of television signals. When the image changes from black to white or vice-versa there is typically a 10 dB change in the power transmitted; if the insertion phase changes by more than 1° it creates a "haze" around the edges of the white image that gives poor visual quality. Thus, there exists the need for a method to improve linearity, efficiency and stability in solid state transistors utilized in Class AB power amplifiers.

SUMMARY OF THE INVENTION

An object of the present invention is a solid state (semiconductor) RF power device having improved efficiency.

Another object of the invention is a solid state RF power device having reduced intermodulation distortion.

Still another object of the invention is an RF power device having lower device input impedance.

A feature of the invention is the use of a capacitance in the input to an MOS power field effect transistor which swamps non-linear variations of gate-drain parasitic capacitance ($C_{GD}$).

Briefly, in a preferred embodiment a DMOS power Field Effect Transistor has an input connected between the gate and the source of the device and the output taken between the drain and source. The source is preferably grounded. Input leads to the gate provide input inductance, and a discrete capacitor is connected between the input leads and the source. The value of the capacitance and inductance are chosen so that the device input resonant frequency is above the fundamental but below the first harmonic of the operating frequency. This resonance is adjusted for each specific application. Further, the value of the capacitor swamps the non-linear variations of $C_{GD}$ the gate-drain capacitance of the transistor, thereby improving phase non-linearity.

The invention and objects and features thereof will be more readily apparent from the following detailed description and appended claims when taken with the drawing.

BRIEF DESCRIPTION OF THE DRAWING

FIG. 4 is a plot of gate-drain capacitance ($C_{GD}$) versus the voltage differential between the drain and gate.

FIG. 5 is a plot of gate-drain transfer characteristics for the device of FIG. 3.

FIG. 6 is an electrical schematic of a device using a DMOS transistor and an input capacitor in accordance with one embodiment of the invention.

DETAILED DESCRIPTION OF ILLUSTRATIVE EMBODIMENTS

Figure 1:
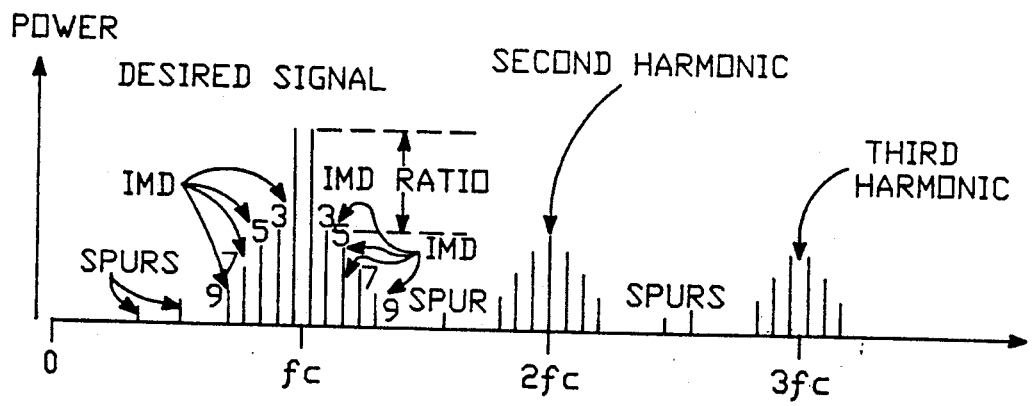
FIG. 1 is a plot of frequency versus power and illustrates distortion products in an RF power amplifier.
Figure 2:
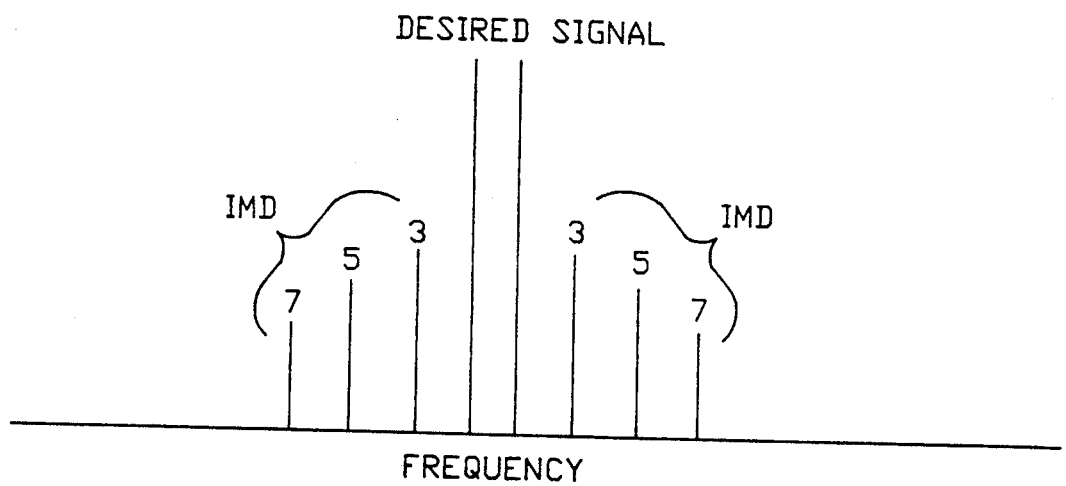
FIG. 2 is a plot of frequency versus power illustrating uneven intermodulation products amplitude due to phase distortion.
Figure 3:
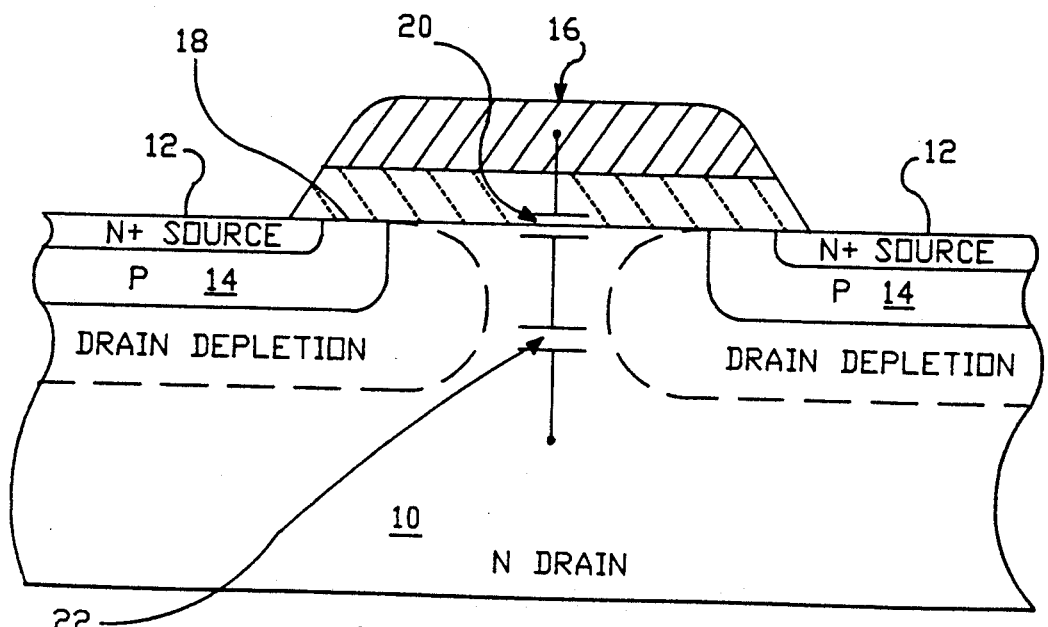
FIG. 3 is a cross sectional view of a DMOS enhancement mode field effect transistor illustrating gate-drain parasitic capacitance.

An RF power device in accordance with a preferred embodiment of the invention employs a DMOS enhancement mode MOS field effect transistor and an input capacitor. FIG. 3 is a section view of the MOS transistor in such a device in which an n-doped silicon substrate 10 functions as the drain region. N+ source regions 12 are formed by n+ doping of the surface region within a p-doped region (expitaxial layer) 14. The p-region 14 between the n+ source regions 12 and the n-doped drain region 10 functions as the channel regions for the transistor. A polysilicon gate contact 16 overlays the channel regions with an insulator such as silicon oxide 18 in-between.

A parasitic gate-drain capacitance ($C_{GD}$) exists between the gate contact 16 and the underlying drain region as illustrated by the serially connected capacitors 20 and 22. Capacitor 20 is the gate oxide capacitance and capacitor 22 is the capacitance of the drain depletion layer beneath the gate oxide. This later component exists only when the potential on the drain surface region is more positive than the potential of the gate. When the gate is more positive, an accumulation layer forms at the semiconductor surface and $C_{GD}$ equals $C_{OX}A_G$ where $C_{OX}$ equals Eo (the semiconductor dielectric constant) over $T_OX$, (the gate oxide thickness) and $A_G$ is the area of the gate. As the drain potential rises above that of the gate, the value of $C_{GD}$ falls quite sharply. It continues to fall progressively as the depletion layer extends deeply into the semiconductor body. This is illustrated in FIG. 4 which is a plot of gate-drain capacitance ($C_{GD}$) versus the voltage differential between the drain and gate. From this curve it can be seen that this capacitance variation with gate voltage is highly non-linear and disturbs the otherwise excellent phase linearity of the device.

The ideal power MOS field effect transistor exhibits a square law forward transfer characteristic for a portion of the drain transfer curve. That is, at low drain voltages, the drain current varies as the square of the gate bias voltage and the current is given in ideal form by (for enhancement mode devices operating in the current saturation region and with no consideration to carrier velocity effect):

$$I_D = \tfrac{1}{2}K(V_{GS}-V_T)^2 \qquad (1)$$

Where:
K = Device Transconductance Parameter
$V_{GS}$ = Gate Source Voltage
$V_T$ = Threshold Voltage This equation is modified for short channel DMOS devices by introducing the effects of limiting carrier drift velocity ($V_S$) over an appropriate length of the channel, before actual pinch off occurs, as shown:

$$I_D = \tfrac{1}{2}K(V_{GS}-V_T)V_S \qquad (2)$$

Therefore the curve is "linearized" by this velocity saturation effect and the second order mixing effects are diminished. At high current and high drain voltage values, a parasitic JFET exists in the drain current path between the body diffusions which limits this current (see FIG. 3). These effects are shown in FIG. 5 where the full transfer characteristics of the device are plotted.

FIG. 6 is an electrical schematic of an RF power device in accordance with the invention which includes a DMOS FET 30 with the input signal applied between a grounded source and leads L1, L2 applied to the gate of the transistor. The output is taken between the drain and the source of the transistor. In accordance with the invention a capacitor, C, shown and 32 is connected between the inductances L1, L2 and the grounded source. The value of capacitor C is chosen such that the device input resonant frequency is above the fundamental and near the first harmonic of the applied signal with a value of the capacitor chosen about equal to the Miller value for the $C_{GD}$ of the transistor. The non-linear variations of $C_{GD}$ are swamped by this input capacitor and phase non-linearity is thereby improved. Lower $C_{RSS}$ moves the feedback contribution close to where the device has forward gain. By swamping the input with a large capacitance, the Miller feedback contribution is reduced and the gain of the circuit is controlled by the MOS transistor and not by the feedback as would be in a traditional operational amplifier situation.

Figure 7A:
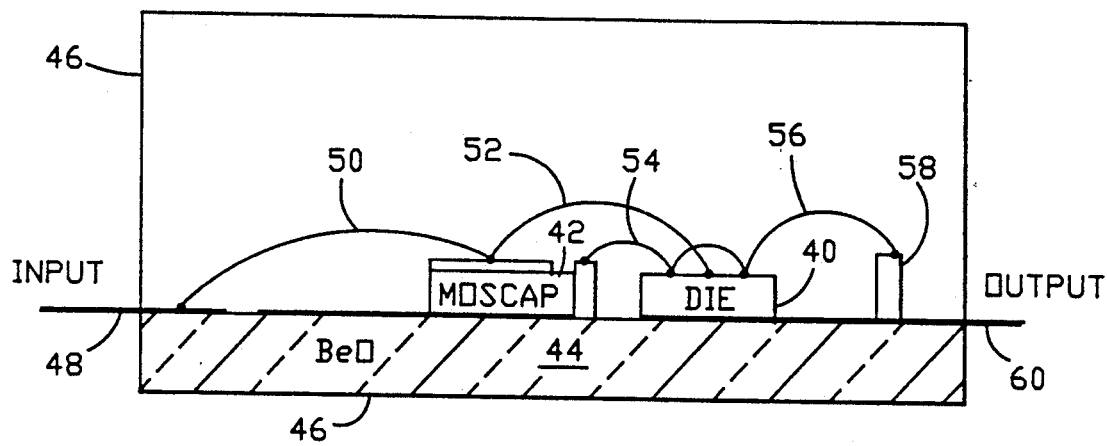
FIGS. 7A and 7B are a top view and a side view respectively of one implementation of the circuit of FIG. 6.
Figure 7B:
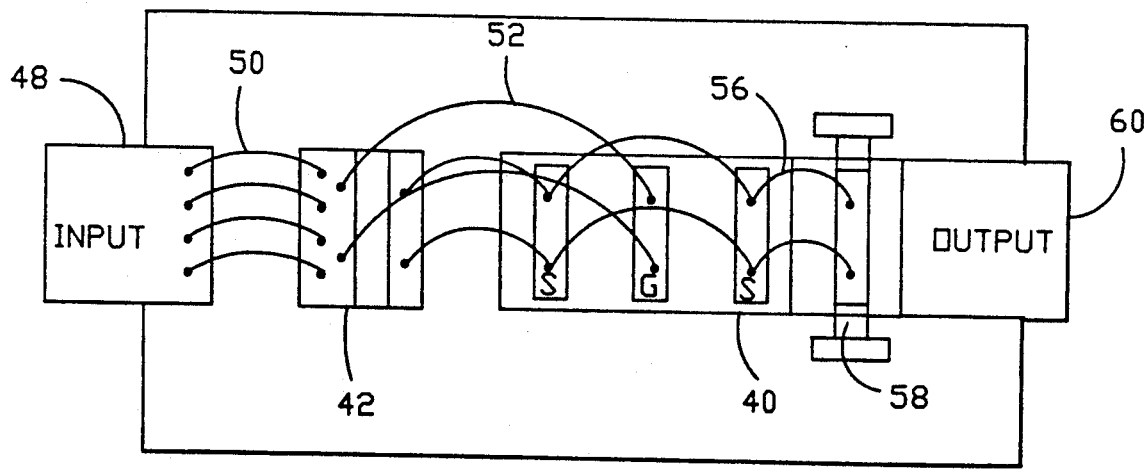

FIGS. 7A and 7B are a side view and a top view, respectively, of one implementation of the circuit. The FET die 40 and a MOSCAP 42 are mounted on a beryllium oxide ceramic substrate 44. A housing 46 encapsulates the die and MOSCAP on the substrate 44. An input lead 48 is connected to the MOSCAP by leads 50, and leads 52 connect the input to the gate contact of die 40. Leads 54 connect the grounded electrode to MOSCAP 42 to the source element of die 40, and leads 56 connect the source to a ground via pad 58. The output lead 60 connects directly to the drain region of die 40.

By placing the capacitor inside the device package, parasitics are better controlled and the swamping effect occurs without degradation in power gain or bandwidth. The efficiency improvement is a byproduct of the lower generator impedance obtained with this device construction. Since the input signal has a short rise and fall time, lower input impedance helps to reduce switching dissipation and an improvement in efficiency is obtained. Further, the lowering of the generator impedance produces a stability improvement.

For example, in one embodiment of the invention one power MOS transistor, operating at 67 MHZ had an input MOS Capacitor of value equal to 560 picofarads connected to the gate and the input signal with wire lead inductances such that the input resonant frequency of the device was set at approximately 100 MHZ. The measured collector efficiency of the device at 90 watts of output power was 69.4% versus 61% without the capacitor and inductance. The gain of the device was 24.8 db with the capacitor and 23.9 db without the capacitor. For a television transmitter application the low power incidental phase modulation valve was reduced by a factor of 2.

There has been described an RF power amplifier employing solid state components which has improved operating efficiency and reduced intermodulation distortion.

While the invention has been described with reference to a preferred embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power device comprising
   a MOS transistor having a source, a drain, and a gate,
   first means for applying an input signal between said gate and said source,
   second means for receiving an output signal from between said source and said drain, and
   a capacitor connected between said gate and said source, said capacitor swamping non-linear variations of parasitic capacitance ($C_{GD}$) between said gate and said drain.

2. The RF power device as defined by claim 1 wherein said first means includes lead wires having inductance.

3. The RF power device as defined by claim 2 wherein the input signal is characterized by a fundamental frequency, said capacitor and said inductance defining a device input resonant frequency above said fundamental frequency and near the first harmonic of said resonant frequency.

4. The RF power device as defined by claim 3 wherein said MOS transistor comprises a first discrete semiconductor body, said capacitor comprises a second discrete semiconductor body, and further including a ceramic substrate on which said first discrete semiconductor body and said second discrete semiconductor body are supported.

5. The RF power device as defined by claim 4 wherein said ceramic substrate includes a metal layer at ground potential said capacitor and said source being electrically connected to said metal layer.

6. The RF power device as defined by claim 4 and further including a package for hermetically sealing said capacitor and said MOS transistor.

7. The RF power device as defined by claim 6 wherein said MOS transistor comprises a DMOS enhancement mode transistor.

8. The RF power device as defined by claim 1 and further including a package for hermetically sealing said capacitor and said MOS transistor.

9. The RF power device as defined by claim 8 wherein said capacitor comprises a MOSCAP.

10. The RF power device as defined by claim 1 wherein said capacitor has a capacitance value approximately equal to the Miller effect of the parasitic capacitance ($C_{GD}$).

* * * * *